United States Patent
Nelson

(10) Patent No.: US 6,545,543 B2
(45) Date of Patent: Apr. 8, 2003

(54) SMALL ASPECT RATIO MMIC POWER AMPLIFIER LAYOUT

(75) Inventor: Stephen R. Nelson, Springfield, MO (US)

(73) Assignee: REMEC, Inc., Richardson, TX (US)

( * ) Notice: Subject to any disclaimer, the term of this patent is extended or adjusted under 35 U.S.C. 154(b) by 0 days.

(21) Appl. No.: 09/900,562

(22) Filed: Jul. 6, 2001

(65) Prior Publication Data

US 2003/0006847 A1 Jan. 9, 2003

(51) Int. Cl.$^7$ ................................................. H03F 3/14
(52) U.S. Cl. ........................ 330/307; 330/286; 257/341
(58) Field of Search ............................... 257/341, 401, 257/275; 330/286, 307, 295, 277

(56) References Cited

U.S. PATENT DOCUMENTS

| | | | |
|---|---|---|---|
| 4,733,195 A | 3/1988 | Tserng et al. | 330/286 |
| 5,023,677 A | 6/1991 | Truitt | 357/22 |
| 5,025,296 A | 6/1991 | Fullerton et al. | 357/23.8 |
| 5,283,452 A | 2/1994 | Shih et al. | 257/277 |
| 5,355,095 A | 10/1994 | Nathanson et al. | 330/264 |
| 5,396,097 A * | 3/1995 | Robb et al. | 257/341 |
| 5,519,358 A | 5/1996 | Tserng | 330/307 |
| 6,023,086 A * | 2/2000 | Reyes et al. | 257/341 |
| 6,081,006 A | 6/2000 | Nelson | 257/276 |
| 6,346,728 B1 * | 2/2002 | Inoue et al. | 257/341 |

OTHER PUBLICATIONS

J. Pusl, B. Agarwal, R. Pullela, L.D. Nguyen, M.V. Lee, M.J.W. Rodwell, L. Larson, J.F. Jensen, R.Y. Yu, and M.G. Case; "Capacitive Division Traveling Wave Amplifier with 340 GHz Gain–Bandwidth Product"; 1995 IEEE MTT–S International Microwave Symposium, May 15–19, Orlando; pp. 1661–1664.

B. Agarwal, A.E. Schmitz, J.J. Brown, M. Matloubian, M.G.Case, M. Le, M. Lui and M.J.W. Rodwell; "112 GHz, 157 GHz, and 180 GHz InP HEMT Traveling–Wave Amplifiers"; IEEE Trans. MTT, Dec. 1998; pp. 2553–2559.

C. Byl and Y. Crosnier, "Modeling and Optimization of Traveling Wave Field Effect Transistors"; Journal of Electromagnetic Waves and Applications; vol. 5, No. 4/5, 1991; pp. 419–438.

K. Narahara and T. Otsuji; "Compression of Electrical Pulses Using Traveling–Wave Field Effect Transistors"; Japan Journal of Applied Physics; vol. 38, Part 1, No. 8; Aug. 15, 1999; pp. 4688–4695.

PCT International Search Report dated Nov. 8, 2002.

* cited by examiner

Primary Examiner—Tuan T. Lam
Assistant Examiner—Hiep Nguyen
(74) Attorney, Agent, or Firm—Jenkens & Gilchrist, P.C.

(57) ABSTRACT

A small aspect ratio, high power MMIC amplifier is disclosed. The small aspect ratio MMIC amplifier is capable of achieving the same power levels as conventional power amplifier designs, but with an aspect ratio of near 1:1, versus 4:1 of conventional power amplifiers. The small aspect ratio MMIC amplifier layout uses two different types of FETs, with all gate fingers of both types of FETs running in the same direction. One type of FET is a conventional FET, in which the gate stripes run parallel to the direction of the output. In the conventional FET, the gate manifold and the drain manifold both generally extend in the x-direction (parallel to each other). The other type of FET has gate fingers that run perpendicular to the direction of the output. In this other type of FET, the gate manifold generally extends in the x-direction, while the drain manifold generally extends in the y-direction (perpendicular to each other). By using two different types of FETs, large gate width power FETs can be placed on two, three or four sides of the MMIC.

35 Claims, 9 Drawing Sheets

SMALL ASPECT RATIO MMIC POWER AMPLIFIER LAYOUT

BACKGROUND OF THE INVENTION

1. Field of the Invention

The present invention relates generally to high-frequency power transistors, and specifically to monolithic microwave integrated circuit (MMIC) amplifiers.

2. Description of Related Art

High-frequency power transistors have traditionally occupied a large amount of the area available on a monolithic integrated circuit. The higher the output power requirements, the larger the gate width of the power transistor. For example, the gates of metal semiconductor field effect transistors (MESFETs) often exceed one millimeter in total periphery, and can extend across the entire width of the integrated circuit.

Thus, high power monolithic microwave integrated circuit (MMIC) amplifiers typically become very wide and take on a rectangular aspect ratio, which may reach width-to-length ratios of 4:1 or higher. These high aspect ratio MMICs are subject to higher stress levels during wafer processing, wafer handling, die separation and MMIC assembly. In addition, semiconductor materials, such as gallium arsenide (GaAs), are typically brittle, which results in lower overall MMIC yields due to die cracking.

Wide MMIC amplifiers also create significant packaging and housing problems at mm-wave frequencies. The wide MMIC amplifiers must be mounted in wide waveguide cavities, which may allow higher order modes of electromagnetic wave propagation, leading to additional radiation losses, coupling problems from one circuit to another, resonances and isolation problems that can create amplifier instabilities (i.e., spurious responses or oscillations).

Traditionally, placement of large gate width cells on both the horizontal and vertical (x, y) edices of GaAs MMICs has been restricted because GaAs requires that all FET gates (e.g., FET channels and gate fingers) on a MMIC amplifier must run in the same direction. Since GaAs etches in an anisotropic way, all gates on a GaAs MMIC must be placed in one direction. Therefore, MMICs with the same physical area, but with smaller aspect ratios, have not been able to be designed.

Small aspect ratio MMICs would be advantageous since fewer high aspect ratio MMICs can be placed on a fixed diameter wafer than MMICs with the same area, but with smaller aspect ratios. Therefore, the yield loss on a wafer implementing high aspect ratio MMICs may range from less than one percent to several percent, depending upon die area and differences in aspect ratios. As a result, small aspect ratio MMICs are less expensive to produce than MMICs with the same area, but with larger aspect ratios.

SUMMARY OF THE INVENTION

A small aspect ratio, high power MMIC amplifier is disclosed. The small aspect ratio MMIC amplifier is capable of achieving the same power levels as conventional power amplifier designs, but with an aspect ratio of near 1:1, versus 4:1 of conventional power amplifiers. The small aspect ratio MMIC is narrower than conventional high power amplifiers, simplifying handling, assembly, packaging and housing issues, and greatly reducing the chances of unwanted resonances or instabilities for the assembled circuit in complex multi-chip modules.

The small aspect ratio MMIC power amplifier layout uses two different types of FETs, with all gate fingers of both types of FETs running in the same direction. One type of FET is a conventional FET, in which the gate fingers run parallel to the direction of the output. In the conventional FET, the gate manifold and the drain manifold both generally extend in the x-direction (parallel to each other). The other type of FET has gate fingers that run perpendicular to the direction of the output. In this other type of FET, the gate manifold generally extends in the x-direction, while the drain manifold generally extends in the y-direction (perpendicular to each other). By using two different types of FETs, large gate width power FETs can be placed on two, three or four sides of the MMIC, versus the conventional power amplifier layout where large gate width FETs are placed in parallel and run along or near one edge (side) of the MMIC amplifier.

The small aspect ratio MMIC power amplifier layout also reduces the width of external divider and combiner circuitry, which is often required to achieve very high power levels from single or multiple MMIC amplifiers. Furthermore, the small aspect ratio MMIC amplifier layout allows more MMICs to be placed in fixed width transmitter modules, enabling higher transmitter power levels to be achieved.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE EXEMPLARY EMBODIMENTS

The numerous innovative teachings of the present application will be described with particular reference to the exemplary embodiments. However, it should be understood that these embodiments provide only a few examples of the many advantageous uses of the innovative teachings herein. In general, statements made in the specification of the present application do not necessarily delimit any of the various claimed inventions. Moreover, some statements may apply to some inventive features, but not to others.

Figure 1:
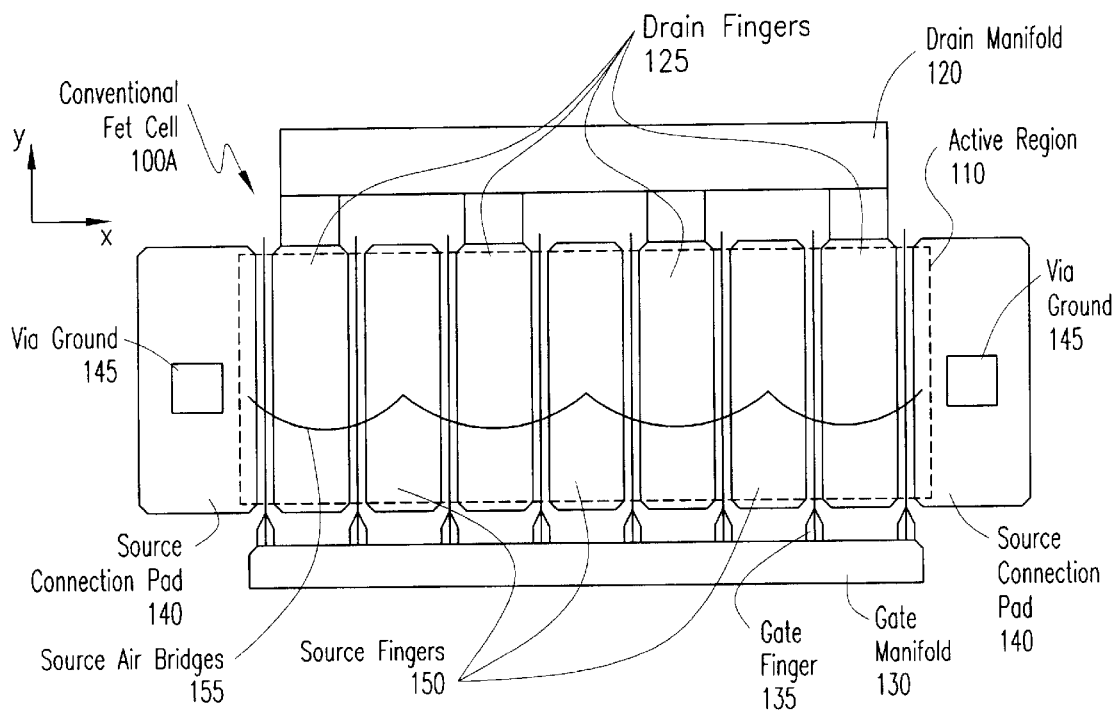
FIG. 1 is a plan view of a conventional FET design.

FIG. 1 shows a conventional interdigitated FET 100A structure. The conventional FET 100A includes a plurality of transversely spaced Metal-Schottky field effect transistor (MESFET) unit cells fabricated in a III-V material substrate, such as gallium arsenide (GaAs), gallium nitride or indium phosphide, each including a doped source, drain and channel regions formed within an active region 110 of the III-V material substrate. The conventional FET 100A further includes a plurality of parallel, elongated drain fingers 125 which overlie the drain regions of the MESFETs, and which are in electrical connection therewith. The drain fingers 125 are interconnected together at one end by a drain manifold 120, which enables the drain fingers 125 to be collectively connected to external circuitry (not shown). A plurality of source fingers 150 in electrical connection with the source regions of the MESFETs are interspersed between the respective drain fingers 125.

Furthermore, a plurality of gate fingers 135 in electrical connection with the channel regions of the MESFETs are interspersed between the respective drain fingers 125 and source fingers 150. The gate fingers 135 are interconnected together at one end by a gate manifold 130, which provides the input signal to the gate fingers 135 in parallel. As shown in FIG. 1, RF input to the conventional FET 100A is from the bottom (gate 130) side, and RF output from the conventional FET 100A is from the top (drain 120) side. Therefore, the gate fingers 135 in the conventional FET 100A run parallel to the direction of RF output from the FET 100A. In addition, as can be seen, the gate manifold 130 and the drain manifold 120 both generally extend in the x-direction (parallel to each other).

Source connection pads 140 provided on either side of the conventional FET 100A are connected to a ground plane (not shown) on the opposite side of the GaAs substrate by electrically conductive vertical interconnects or vias 145. The source fingers 150 are connected to the source connection pads 140 by electrically conductive air bridges 155. The air bridges 155 extend over the drain fingers 125 and gate fingers 135 and are bonded to the metallization of the source fingers 150.

In FIG. 1, all gate fingers 135 run vertically in the y-direction and are paralleled in the x-direction. With this conventional FET 100A structure, gate finger 135 width cannot be increased significantly in the y-direction due to frequency limitations tied to gate parasitics and the distributed nature of the gate. Therefore, increasing FET total gate width requires placing more FETs in parallel in the x-direction, which greatly increases the width of the FET 100A.

Figure 2:
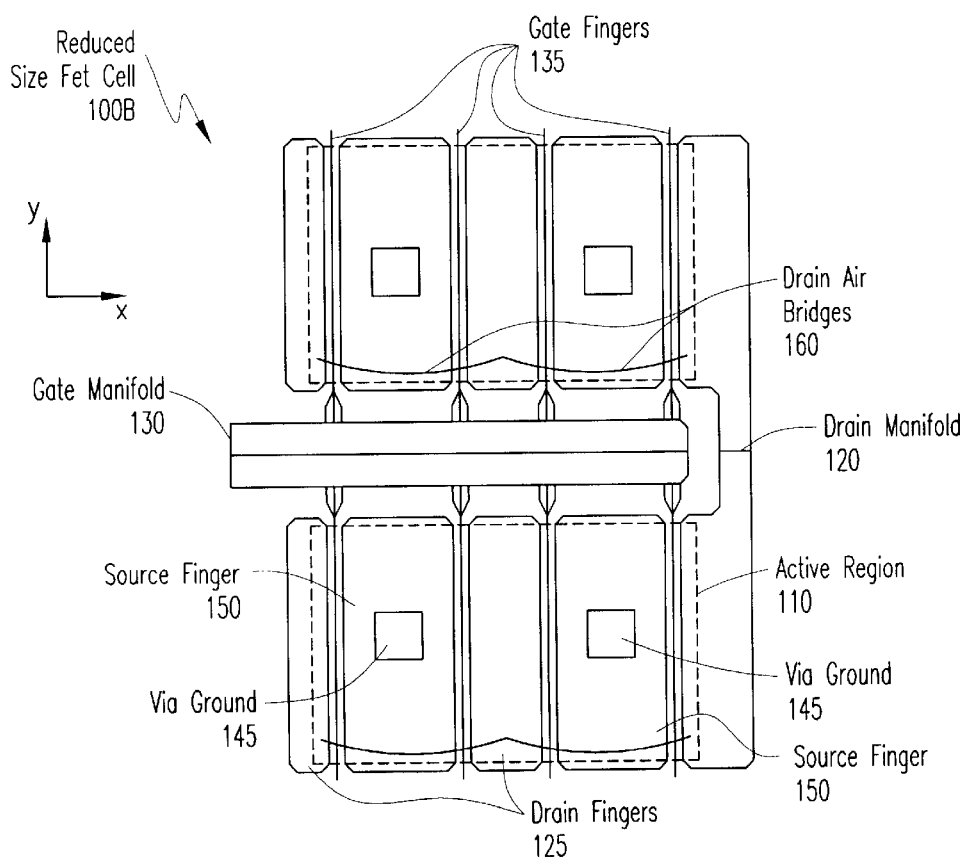
FIG. 2 is a plan view of a reduced size FET design.

FIG. 2 shows a reduced sized FET 100B structure of the type described in U.S. Pat. No. 6,081,006 to Nelson (hereinafter referred to as Nelson), which is hereby incorporated by reference. The reduced size FET 100B contains a single gate manifold 130 with multiple gate "stripes" (fingers) 135 running along both sides of the gate manifold 130. As shown in FIG. 2, these gate fingers 135 run vertically in the y-direction, and are placed in parallel with each other in the x-direction. The drain fingers 125 on both sides of the gate manifold 130 are interconnected by drain air bridges 160 to the drain manifold 120 at one end of the reduced size FET 100B. In the Nelson FET 100B structure, instead of connecting all of the source fingers 150 to a grounded source connection pad (as shown in FIG. 1), each of the source fingers 150 is individually connected to the ground plane on the opposite side of the GaAs substrate by electrically conductive vertical interconnects or vias 145.

Total FET gate width can be increased by adding gate fingers 135 (FET channels) in the x-direction, or by placing more reduced size FETs 100B in the y-direction. The ability of the reduced size FET 100B structure to be expanded in either the x- or y-direction enables the reduced size FET 100B to be made narrower (less wide) than most standard interdigitated FETs 100A (shown in FIG. 1), which when expanded in total gate width can become very wide, as discussed above.

In the reduced size FET 100B structure shown in FIG. 2, RF input to the FET 100B is from the left (gate 130) side, and RF output from the FET 100B is from the right (drain 120) side. Therefore, the gate fingers 135 in the reduced size FETs 100B run perpendicular to the direction of RF output from the reduced size FETs 100B. In addition, as can be seen, the gate manifold 130 generally extends in the x-direction, while the drain manifold 120 generally extends in the y-direction (perpendicular to each other).

By comparing FIGS. 1 and 2, it is apparent that the direction of the RF in/out for the reduced size FET 100B structure shown in FIG. 2, with gate fingers 135 placed vertically (y-direction), is 90 degrees different from (orthogonal to) the conventional FET 100A structure shown in FIG. 1. However, although the RF input/output ports for the FETs 100A and 100B in FIGS. 1 and 2 are orthogonal to each other, the gate fingers 135 for both FETs 100A and 100B all run in the same direction. Having the gate fingers 135 for both types of FET 100A and 100B structures run in the same direction permits both types of FET 100A and 100B structures to be placed on the same MMIC.

The conventional approach to building a high power GaAs FET amplifier microwave integrated circuit has been to parallel large numbers of FETs in one direction along the chip (die). For example, referring now to FIGS. 3A–3C, assume an FET-based single MMIC power amplifier 200 provides two watts (W) of output power at a given frequency, for instance, 20 gigahertz (GHz). If 4 W output power is needed from a single MMIC 200 at this frequency, the total FET gate width in the output stage of the amplifier would have to be increased by a factor of two or more. This is typically achieved by doubling the width of both the FET and the MMIC, in comparison to the dimensions of the 2-W MMIC amplifier.

Figure 3A:
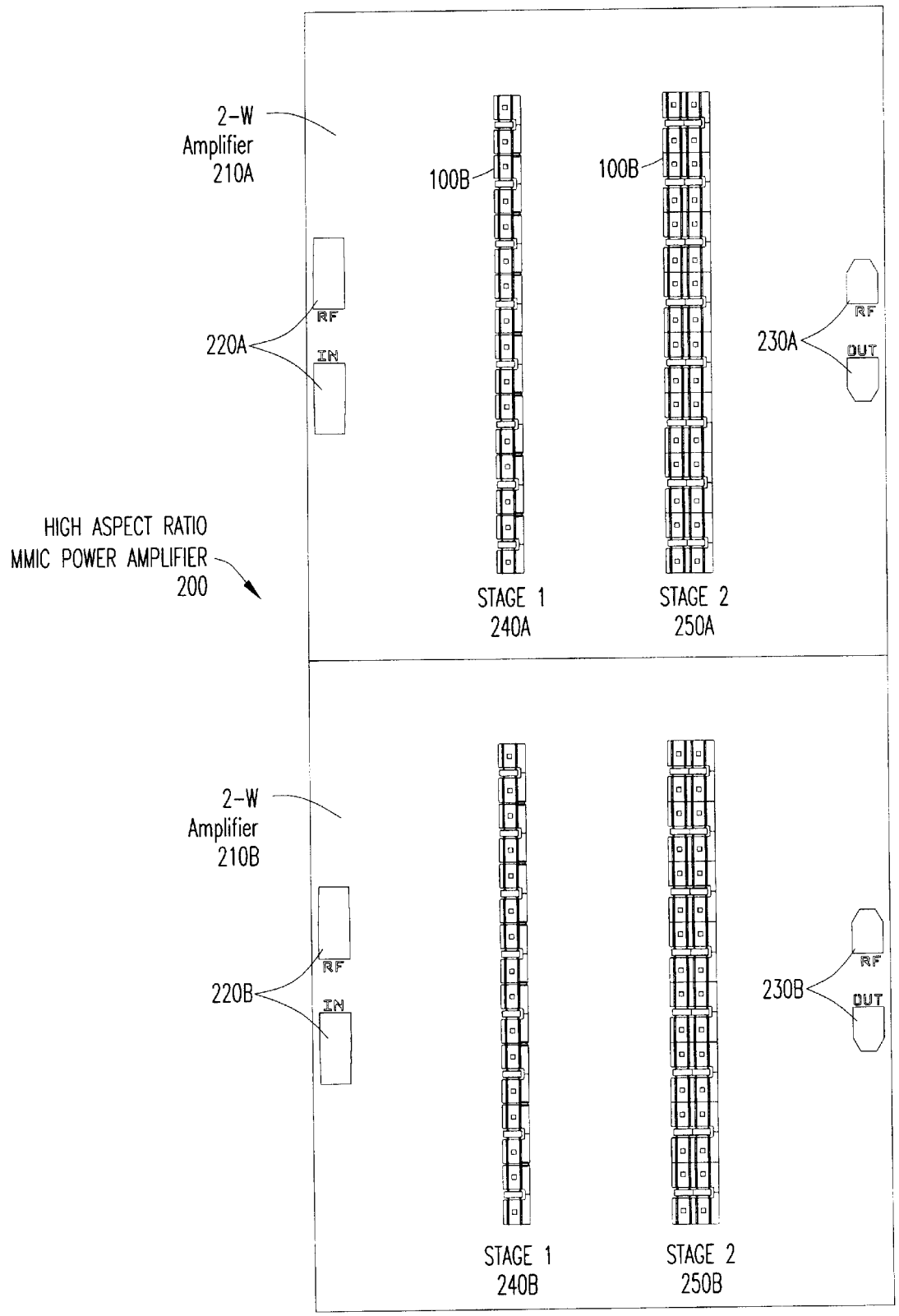
FIGS. 3A–3C illustrate the conventional design for increasing the MMIC amplifier output power by placing multiple MMIC power amplifiers in parallel.
Figure 3B:
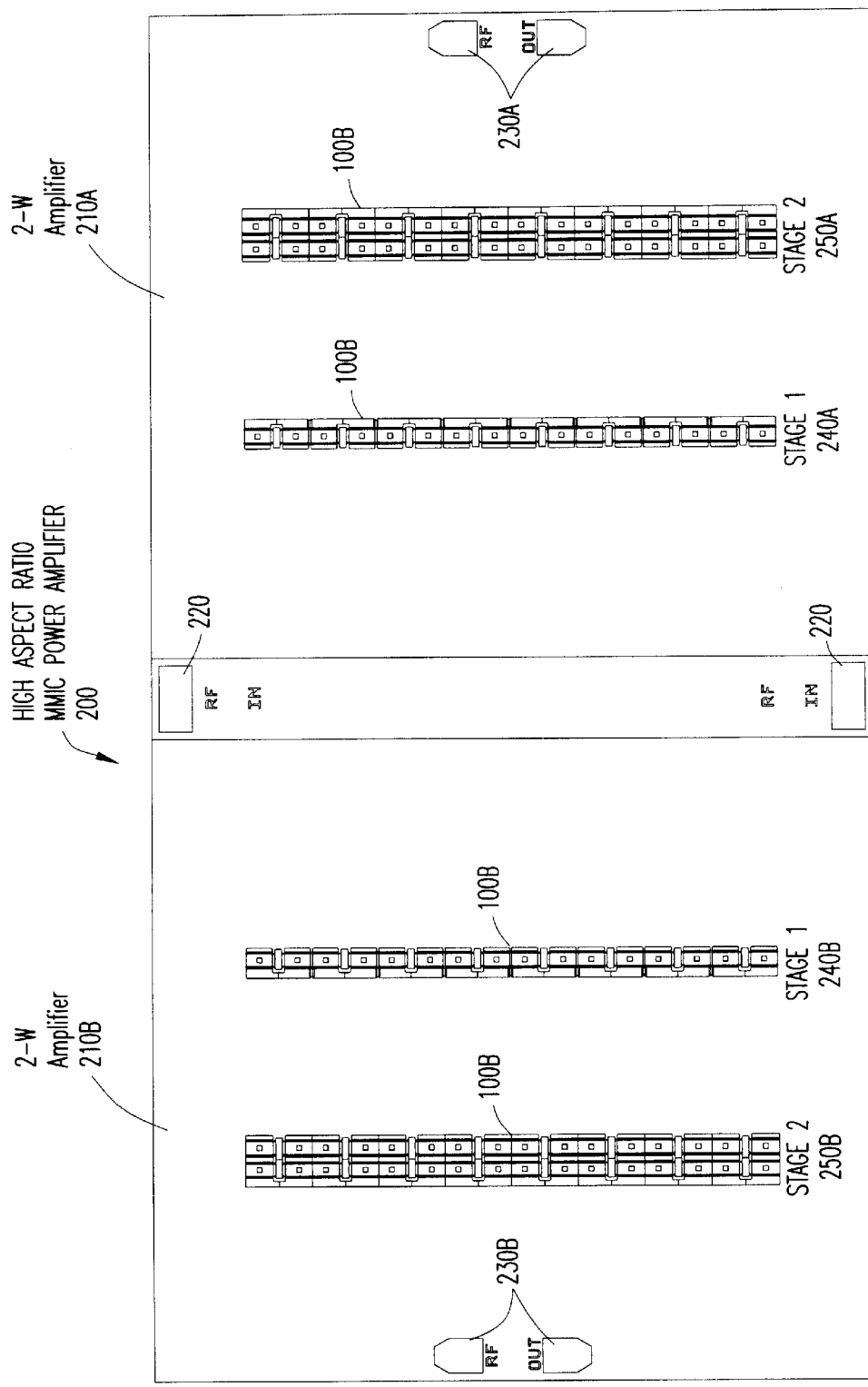

Thus, as shown in FIGS. 3A and 3B, two 2-W amplifiers 210A and 210B are placed in parallel on the same MMIC 200, enabling, with combining, a power output of 4-W. The MMICs 200 of FIGS. 3A and 3B have a width to length aspect ratio of 2:1. There are two layout options for placing two amplifiers 210A and 210B on the same MMIC 200. The first layout option is shown in FIG. 3A, which illustrates two FET 2-W amplifiers 210A and 210B in parallel, separate RF inputs 220A and 220B to the two amplifiers 210A and 210B, respectively, are at the left, and separate RF outputs 230A and 230B from the two amplifiers 210A and 210B, respectively, are at the right. Each 2-W amplifier 210A and 210B consists of two stages 240 and 250 of reduced size FETs 100B. The dimensions of each 2-W amplifier shown are 2 mm by 2 mm, with a total area of 4 mm. By combining the two amplifiers 210A and 210B in parallel, the dimensions of the MMIC 200 are increased to 2 mm by 4 mm, with a total area of 8 mm.

Figure 3C:
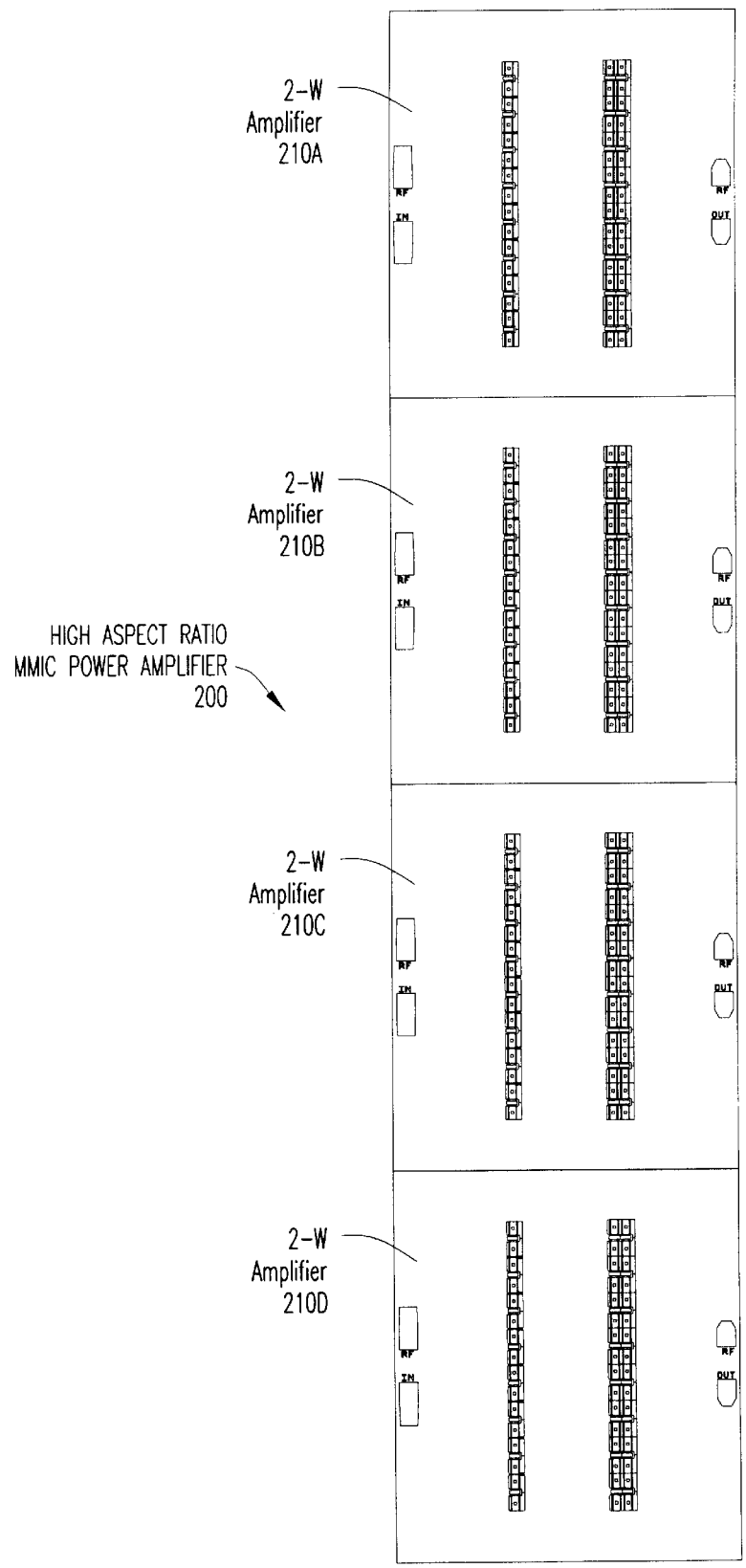

The second conventional 4-W layout option is shown in FIG. 3B, which illustrates a single RF input 220 to both reduced size FET amplifiers 210A and 210B either at the top or bottom. The RF outputs 230A and 230B from the two amplifiers 210A and 210B, respectively, are at the left and right, 180 degrees apart. The dimensions of the MMIC 200 shown in FIG. 3B are also 2 mm by 4 mm, with a total area of 8 mm. In order to conveniently increase the power requirement to 8 W, as shown in FIG. 3C, four 2-W amplifiers 210A–210D are paralleled on the same MMIC 200. Thus, conventional design and layout results in an 8-W MMIC 200 with dimensions of at least 2 mm (long) by 8 mm (wide), with a total area of 16 mm. (The aspect ratio of the NMIC 200 shown in FIG. 3C is 4:1.).

Figure 4:
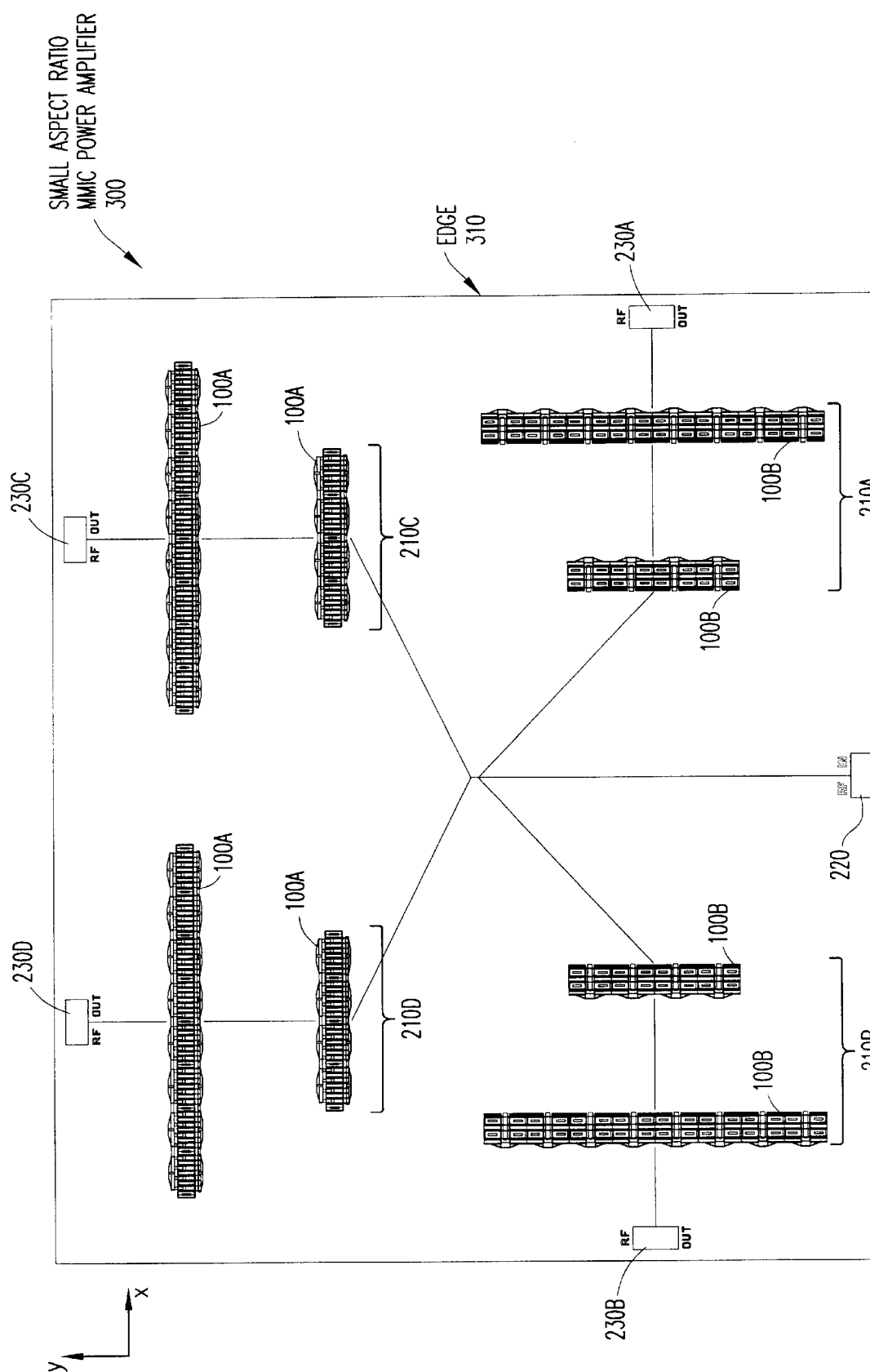
FIG. 4 is a plan view of a small aspect ratio MMIC power amplifier layout in accordance with exemplary embodiments of the present invention.
Figure 5:
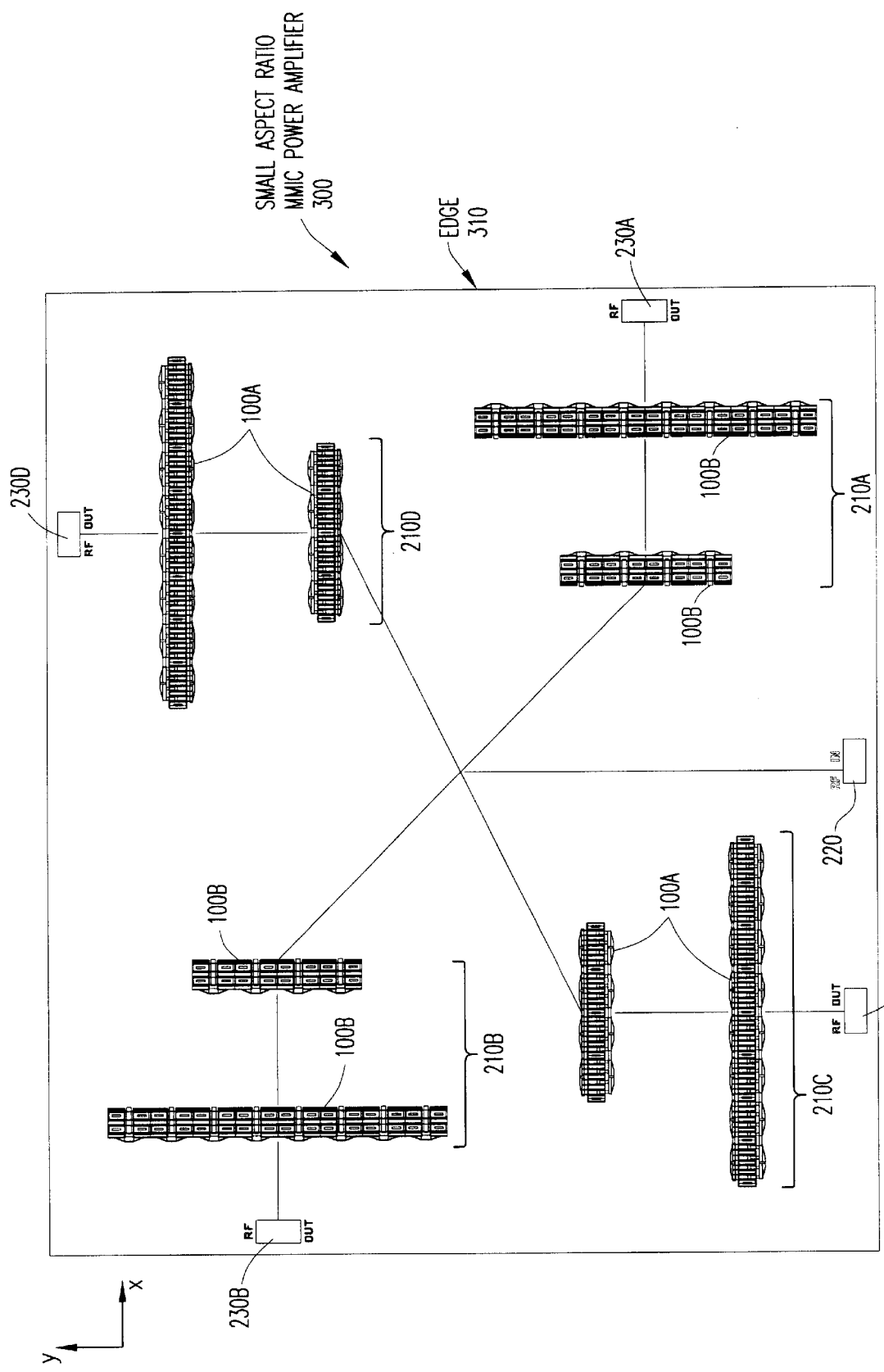
FIG. 5 is a plan view of an alternate small aspect ratio MMIC power amplifier layout in accordance with exemplary embodiments of the present invention.

In order to build a high power MMIC amplifier that achieves the same power levels as conventional power amplifier designs, but which can be built with aspect ratios of near 1:1 versus 2:1 or 4:1, the two types of FET structures 100A and 100B shown in FIGS. 1 and 2 can be combined on one MMIC. As shown in the examples of FIGS. 4 and 5, the reduced size FET 100B structure and the conventional interdigitated FET 100A structure can be placed on a MMIC power amplifier 300 such that all gate fingers for both FETs 100A and 100B are running in the same direction, which, as discussed above, is a requirement of GaAs FET processing (i.e., due to the way GaAs is etched, all gate fingers must run in the same direction). However, RF input and output for the reduced size FET 100B structure is orthogonal to (90 degrees different from) the RF input and output of the conventional interdigitated FET 100A structure. RF input for the MMIC 300 is received at a single input port 220 and fed in parallel to all of the FET amplifiers 210A–D on the MMIC 300. The amplified signals from each of the FET amplifiers 210A–D are output to respective output ports 230A–D on the MMIC 300. In addition, the gate manifolds of both FETs 100A and 100B generally extends in the x-direction, while the drain manifolds of the FETs 100A and 100B extend perpendicularly to each other.

It should be understood that FET structures other than those specifically described in FIGS. 1 and 2 can be used to build the small aspect ratio MMIC power amplifier 300 shown in FIGS. 4 and 5. The structure on the MMIC 300 combines two different types of FET structures, one having its gate fingers running parallel to the direction of RF output and one having its gate fingers running perpendicular to the direction of RF output. In addition, the gate manifolds of both FET structures generally extends in the x-direction, while the drain manifolds of the FET structures extend perpendicularly to each other. For example, other conventional FET structures are described in U.S. Pat. No. 5,519,358 to Tserng, U.S. Pat. No. 4,733,195 to Tserng et al., U.S. Pat. No. 5,025,296 to Fullerton et al. and U.S. Pat. No. 5,283,452 to Shih et al., all of which are hereby incorporated by reference. In addition, other reduced size FET structures are described in U.S. Pat. No. 5,023,677 to Truitt and U.S. provisional application serial No. 60/295,207, filed Jun. 1, 2001, both of which are hereby incorporated by reference.

The MMICs 300 in FIGS. 4 and 5 each contain four 2-W amplifiers 210A–D, which are externally combined to achieve an 8-W output power level. The dimensions of the FIGS. 4 and 5 MMICs 300 are approximately 4 mm by 4 mm, with a total area of 16 mm. Thus, although the total area (16 mm) is the same as in the conventional layout shown in FIG. 3C, the aspect ratio (width to length) of the FIGS. 4 and 5 MMICs 300 is approximately 1:1. The combination of the two types of FET 100A and 100B structures allows placement of large gate width power FETs on three sides (edges 310) of the MMIC 300, as shown in FIG. 4, or four sides (edges 310) of the MMIC 300, as shown in FIG. 5. However, it should be understood that the small aspect ratio MMIC 300 layout is not limited to the layouts of FIGS. 4 and 5. Instead, the MMIC 300 layout of the present invention applies to any combination of any number (i.e., two, three, four or more) of the two types of FET 100A and 100B structures on two or more sides of the same MMIC 300.

Therefore, the MMIC power amplifier 300 layout of FIGS. 4 and 5, which uses the reduced size FETs 100B and conventional interdigitated FETs 100A, does not reduce the overall area required to build an 8-W MMIC power amplifier 300. Instead, the layouts of FIGS. 4 and 5 reduce the overall width to length aspect ratio of the 8-W NMIC power amplifier 300, from 4:1 for the conventional layout, to 1:1. In addition, the width of the resulting 8-W MMIC power amplifier 300 is reduced by a factor of 2:1 (i.e., in this case, from 8 mm to 4 mm). In general, the MMIC power amplifier 300 layout of the present invention can be used to change from conventional MMIC power amplifier aspect ratios of 2:1, 3:1, 4:1 or 5:1, to an aspect ratio closer to 1:1, and to reduce MMIC power amplifier width by a factor of approximately 2:1.

Figure 8:
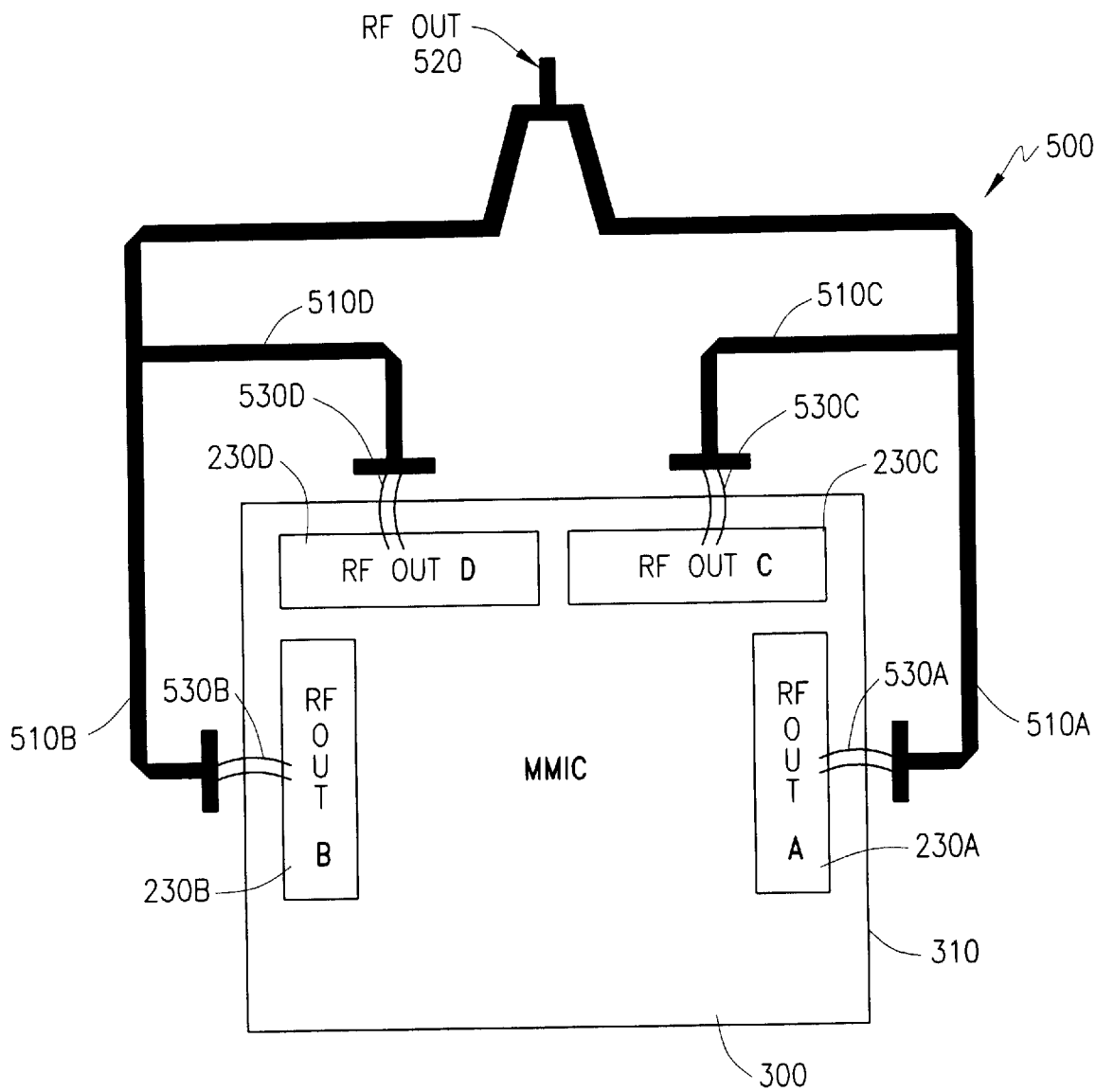
FIG. 8 is a plan view of external combiner circuitry connected to the small aspect ratio MMIC of the present invention.

Referring now to FIG. 8, the MMIC power amplifier 300 layout shown in FIGS. 4 and 5 also reduces the width required for external divider and combiner circuitry 500, which is often required to achieve very high power levels from single or multiple MMIC power amplifiers 300. The combiner circuit 500 for the small aspect ratio MMIC 300 layout can be "wrapped" around the sides 310 of the MMIC 300. The output ports 230A, 230B, 230C and 230D of each of the power amplifiers (not specifically shown in FIG. 8) of the MMIC 300 are connected by respective bond wire interconnections 530A, 530B, 530C and 530D to the combiner circuit 500, which connects to a single RF output 520.

Depending on whether the small aspect ratio MMIC 300 layout has outputs on three sides 310 of the MMIC 300 (as shown in FIG. 4) or four sides 310 of the MMIC 300 (as shown in FIG. 5), the external combiner circuit 500 can be connected to three or four sides 310, respectively, of the small aspect ratio MMIC 300. A wide range of combiner circuits 500, such as Lange couplers, Wilkinsons or traveling-wave combiners, can be used with the small aspect ratio MMIC 300.

It should be noted that there may be small differences in gain and insertion phase between the two different kinds of FETs 100A and 100B on the small aspect ratio MMIC 300. Signals amplified by conventional FETs 100A may be delayed in time with slight differences from the same signals amplified by reduced size FETs 100B. However, this delay difference can be compensated for by adjusting transmission line lengths on the external combiner circuit 500, as is shown in FIG. 8. As can be seen in FIG. 8, the lengths of external lines 510A and 510B for output ports 230A and 230B, respectively, are significantly longer than the lengths of external lines 510C and 510D of output ports 230C and 230D, respectively. By increasing the lengths of lines 510A and 510B, the phase delay of the signals from output ports 230A and 230B is also increased with respect to signals from output ports 230C and 230D. Properly designed, the small aspect ratio MMIC power amplifier 300 with external divider/combiner circuitry 500 can compensate for phase differences between output ports 230.

In addition, gain differences can be modeled and removed during the design of the MMIC 300. For example, the gain differences can be removed by adding resistive loss near the input of the higher gain amplifier to reduce it's gain. Alternatively, the gain differences can be removed by adding loss in a divider network for a particular high gain amplifier circuit. As a further alternative, the gain differences can be removed by making adjustments to the combiner circuit 500 by changing the coupling ratios between amplifier output ports 230.

It should further be noted that the two different FET 100A and 100B structures may also have slight differences in channel temperature and over-temperature performance behavior. However, these temperature differences can also be modeled and accounted for in the design of the MMIC 300 and the FET 100A and 100B structures, in order to keep the temperature differences small. For example, to equalize FET channel temperatures across a MMIC 300, the gate-to-gate spacing and channel x-y placement can be adjusted on the FETs (i.e., all channels do not have to be exactly in parallel in a line fashion on an FET, so that the centers of each channel could follow a curved or chevron structure).

Advantageously, the smaller aspect ratio power MMICs 300 are mechanically stronger, and can be processed, handled and assembled with higher yields than high aspect ratio power MMICs 200 (shown in FIGS. 3A–3C). In addition, the smaller aspect ratio MMICs 300 are much narrower than conventional high power MMIC amplifiers, simplifying handling, assembly, packaging, and housing issues and greatly reducing the chances of unwanted resonances or instabilities for the assembled circuit in complex multi-chip modules. Furthermore, small aspect ratio, reduced-width MMICs 300 can be placed in smaller waveguide cavities than high aspect ratio MMICs. This reduces the risk of higher order propagation modes and radiative coupling between on-chip and external circuit elements.

Another advantage of the small aspect ratio MMIC power amplifier 300 layouts shown in FIGS. 4 and 5 is that the large gate width power FETs 100A and 100B can be thermally isolated from each other more effectively. Since the FETs 100A and 100B on adjacent sides of the MMIC 300 have outputs that are orthogonal to each other, the coupling of heat from one FET 100A to another FET 100B is reduced. In addition, the small aspect ratio MMIC 300 layout allows more power amplifier MMICs 300 to be placed in fixed width transmitter modules, enabling higher transmitter power levels to be achieved. This is particularly important for phased array transmitters (radar or communications arrays), where module widths cannot be increased beyond tight limits. For example, three small aspect ratio MMICs 300 may be inserted inside a module, versus two high aspect ratio MMICs 200 (shown in FIGS. 3A–3C). Likewise, four small aspect ratio MMICs 300 may be inserted inside a module versus three high aspect ratio MMICs 200, and so on.

Figure 6B:
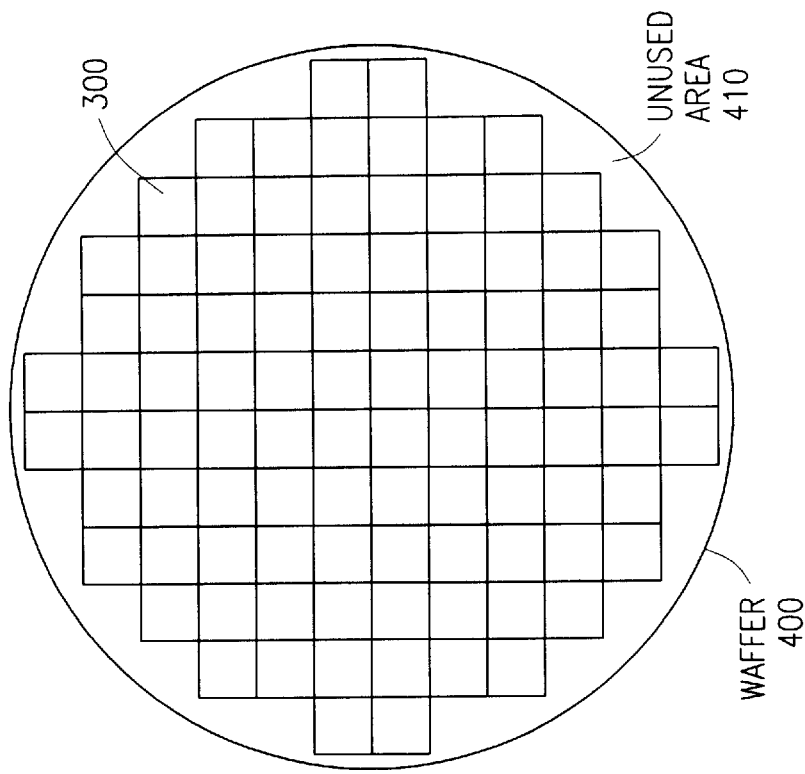
FIG. 6B is a plan view of a wafer having small aspect ratio MMICs in accordance with embodiments of the present invention thereon.
Figure 6A:
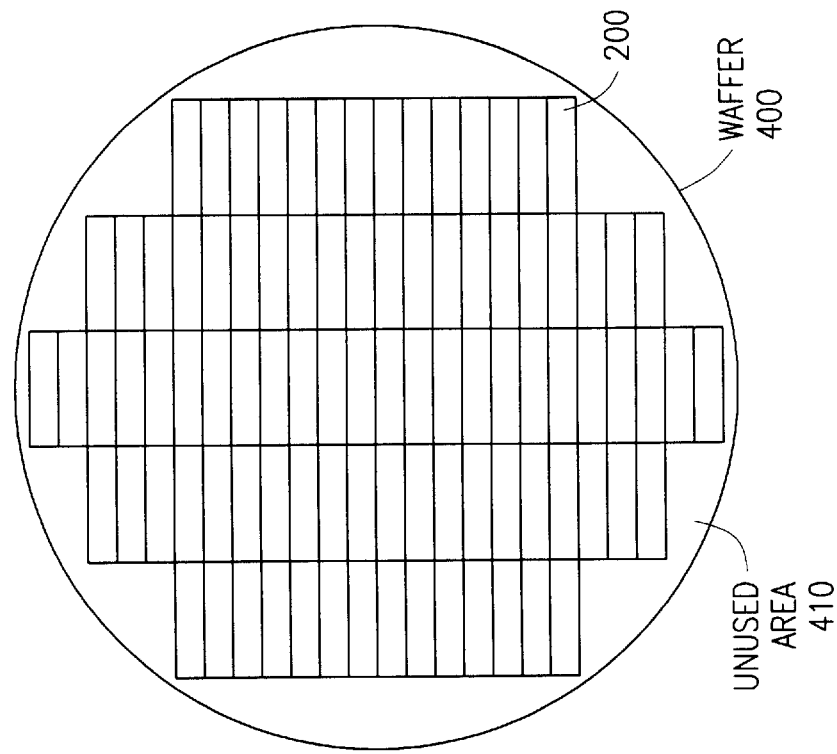
FIG. 6A is a plan view of a wafer having conventional high aspect ratio MMICs thereon.

As shown in FIGS. 6A and 6B, an additional advantage of small aspect ratio MMIC power amplifiers 300 is that more of the small aspect ratio MMICs 300 can be placed on a semiconductor wafer 400 than high aspect ratio MMICs 200 having the same total area. In FIGS. 6A and 6B, two wafers 400 of the same diameter are shown, each containing MMICs 200 and 300 having the same area, but different width to length aspect ratios. The high aspect ratio MMICs 200 of FIG. 6A leave more unused area 410 around the edge of the wafer 400, as compared to the small aspect ratio MMICs 300 of FIG. 6B, resulting in lower overall potential yield for the high aspect ratio MMIC 200. For example, only 92 high aspect ratio MMICs 200 will fit on the same size wafer as 96 small aspect ratio MMICs 300.

Figure 7:
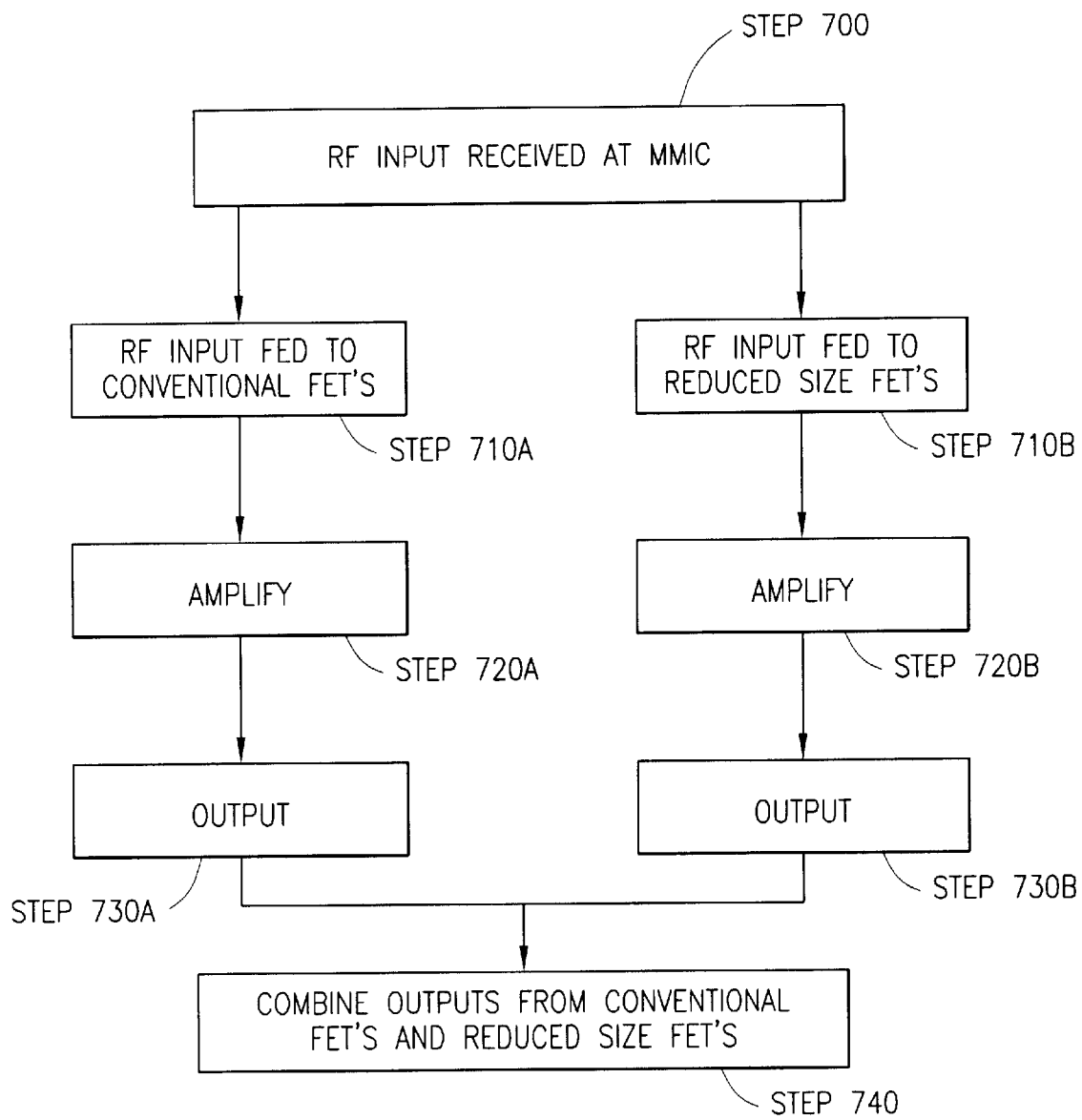
FIG. 7 is a flow chart illustrating the steps for amplifying the power of an input signal using the small aspect ratio MMIC power amplifier of the present invention.

In operation, as illustrated in FIG. 7 of the drawings, when RF input arrives at the input port of the MMIC (step 700), the RF input is fed to one or more conventional FET amplifiers (step 710A) and one or more reduced size FET amplifiers (step 710B) in parallel. The conventional FET amplifier(s) and the reduced size FET amplifier(s) amplify the input signal (steps 720A and 720B, respectively) and output the amplified signal via respective output ports (steps 730A and 730B, respectively). All of the output amplified signals are combined by combiner circuitry to produce a final output amplified signal (step 740).

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

What is claimed is:

1. A monolithic microwave integrated circuit, comprising:
    a first transistor structure having one or more transistors, each having a gate manifold, a drain manifold and one or more gate fingers, said gate manifold and said drain manifold extending parallel to each other; and
    a second transistor structure having one or more transistors, each having a gate manifold, a drain manifold and one or more gate fingers, said gate manifold and said drain manifold of said transistors of said second transistor structure extending perpendicular to each other;
    wherein said gate fingers of transistors of said first transistor structure are parallel to said gate fingers of said transistors of said second transistor structure.

2. The circuit of claim 1, wherein said drain manifolds of said first and second transistor structures are connected to respective output ports, said output port of a first transistor having said first transistor structure being on a first side of said circuit and said output port of a second transistor having said second transistor structure being on a second side of said circuit.

3. The circuit of claim 2, wherein said output port of a third transistor having said first or second transistor structure is on a third side of said circuit.

4. The circuit of claim 3, wherein said output port of said third transistor having said first transistor structure is on said third side of said circuit and said output port of a fourth transistor having said second transistor structure is on a fourth side of said circuit.

5. The circuit of claim 3, wherein said output port said third transistor having said second transistor structure is on said third side and said output port of a fourth transistor having said first transistor structure is on said first side.

6. The circuit of claim 1, wherein said monolithic microwave integrated circuit has a width to length ratio of near 1:1.

7. The circuit of claim 1, further comprising:
    a III-V material substrate, said first and second transistor structures being at least partially formed within said III-V material substrate.

8. The circuit of claim 1, wherein said first transistor structure comprises one or more field effect transistors.

9. The circuit of claim 1, wherein said second transistor structure comprises one or more field effect transistors.

10. A monolithic microwave integrated circuit, comprising:
    a first power amplifier having one or more first transistors of a first transistor structure, each having a gate manifold, a drain manifold and one or more gate fingers, said gate manifold and said drain manifold extending parallel to each other, said drain manifold of an output one of said one or more first transistors being connected to an output port on a first side of said circuit;
    a second power amplifier having one or more second transistors of a second transistor structure, each having a gate manifold, a drain manifold and one or more gate fingers, said gate manifold and said drain manifold of said second transistors extending perpendicular to each other, said drain manifold of an output one of said one or more second transistors being connected to an output port on a second side of said circuit; and a third power amplifier having one or more third transistors of at least one of said first or second transistor structures, said drain manifold of an output one of said third transistors being connected to an output port on a third side of said circuit;

wherein said gate fingers of transistors of said first tansistor structure are parallel to said gate fingers of transistors of said second transistor structure.

11. The circuit of claim 10, further comprising:

a fourth power amplifier having one or more fourth transistors of at least one of said first or second transistor structures, said drain manifold of an output one of said fourth transistors being connected to an output port on a fourth side of said circuit.

12. The circuit of claim 10, wherein at least one of said third transistors is of said second transistor structure, and further comprising:

a fourth power amplifier having one or more fourth transistors, at least one of which is of said first transistor structure, said drain manifold of an output one of said fourth transistors being connected to an output port on said first side.

13. The circuit of claim 10, wherein said monolithic microwave integrated circuit has a width to length ratio of near 1:1.

14. The circuit of claim 10, further comprising:

a III-V material substrate, said first, second and third power amplifiers being at least partially formed within said III-V material substrate.

15. The circuit of claim 10, wherein said one or more first transistors are field effect transistors.

16. The circuit of claim 10, wherein said one or more second transistors are field effect transistors.

17. A wafer, comprising:

at least one monolithic microwave integrated circuit, each said at least one monolithic microwave integrated circuit comprising:

a first transistor structure having one or more transistors, each having a gate manifold, a drain manifold and one or more gate fingers, said gate manifold and said drain manifold extending parallel to each other; and a second transistor structure having one or more transistors, each having a gate manifold, a drain manifold and one or more gate fingers, said gate manifold and said drain manifold of said second transistor extending perpendicular to each other;

wherein said gate fingers of said first transistor structure are parallel to said gate fingers of said second transistor structure.

18. The wafer of claim 17, wherein said drain manifolds of said first and second transistor structures are connected to respective output ports, said output port of a first transistor having said first transistor structure being on a first side of said circuit and said output port of a second transistor having said second transistor structure being on a second side of said circuit.

19. The wafer of claim 18, wherein said output port of a third transistor having said first or second transistor structure is on a third side of said circuit.

20. The wafer of claim 19, wherein said output port of said third transistor having said first transistor structure is on said third side of said circuit and said output port of a fourth transistor having said second transistor structure is on a fourth side of said circuit.

21. The wafer of claim 20, wherein said output port said third transistor having said second transistor structure is on said third side and said output port of a fourth transistor having said first transistor structure is on said first side.

22. The wafer of claim 17, wherein said at least one monolithic microwave integrated circuit has a width to length ratio of near 1:1.

23. The wafer of claim 17, wherein said monolithic microwave integrated circuit further comprises:

a III-V material substrate, said first and second transistor structures being at least partially formed within said III-V material substrate.

24. The wafer of claim 17, wherein said first transistor structure comprises one or more field effect transistors.

25. The wafer of claim 17, wherein said second transistor structure comprises one or more field effect transistors.

26. A method for amplifying the power level of an input signal, comprising:

receiving said input signal by a first power amplifier having at least one first transistor of a first transistor structure on a monolithic microwave integrated circuit, said first transistor further having one or more gate fingers running parallel to the direction of an output of said first transistor;

receiving said input signal by a second power amplifier having at least one second transistor of a second transistor structure on said monolithic microwave integrated circuit, said second transistor further having one or more gate fingers running perpendicular to the direction of said output of said second transistor, said gate fingers of said first transistor being parallel to said gate fingers of said second transistor; and amplifying said input signal by said first and second transistors to produce respective first and second amplified output signals corresponding to said input signal, the direction of said first and second amplified output signals being orthogonal to each other.

27. The method of claim 26, further comprising:

combining at least said first and second amplified output signals to produce a final amplified output signal.

28. The method of claim 26, wherein said first amplified output signal is output on a first side of said monolithic microwave integrated circuit and said second amplified output signal is output on a second side of said monolithic microwave integrated circuit, and further comprising:

receiving said input signal by a third power amplifier having at least one third transistor of at least one of said first or second transistor structures on said monolithic microwave integrated circuit; and amplifying said input signal by said third power amplifier to produce a third amplified output signal that is output on a third side of said monolithic microwave integrated circuit.

29. The method of claim 28, further comprising:

receiving said input signal by a fourth power amplifier having at least one fourth transistor of at least one of said first or second transistor structures on said monolithic microwave integrated circuit; and amplifying said input signal by said fourth power amplifier to produce a fourth amplified output signal that is output on a fourth side of said monolithic microwave integrated circuit.

30. The method of claim 28, wherein at least one of said third transistors is of said second transistor structure, and further comprising:

receiving said input signal by a fourth power amplifier having at least one fourth transistor of said first transistor structure on said monolithic microwave integrated circuit; and amplifying said input signal by said fourth power amplifier to produce a fourth amplified output signal that is output on said first side of said monolithic microwave integrated circuit.

31. A monolithic microwave integrated circuit for amplifying the power level of an input signal, comprising:

a first power amplifier connected to receive said input signal and produce a first amplified output signal at a first output, said first power amplifier having at least one first transistor of a first transistor structure, said first transistor further having one or more gate fingers running parallel to the direction of said first amplified output signal; and a second power amplifier connected to receive said input signal and produce a second amplified output signal at a second output, said second power amplifier having at least one second transistor of a second transistor structure, said second transistor further having one or more gate fingers running perpendicular to the direction of said second amplified output signal, said gate fingers of said first transistor being parallel to said gate fingers of said second transistor;

wherein the direction of said first and second amplified output signals are orthogonal to each other.

32. The circuit of claim 31, further comprising:

combiner circuitry connected to combine at least said first and second amplified output signals to produce a final amplified output signal.

33. The circuit of claim 31, wherein said first output of said first power amplifier is on a first side of said monolithic microwave integrated circuit and said second output of said second power amplifier is on a second side of said monolithic microwave integrated circuit, and further comprising:

a third power amplifier connected to receive said input signal and produce a third amplified output signal at a third output on a third side of said monolithic microwave integrated circuit, said third power amplifier having at least one third transistor of at least one of said first or second transistor structures.

34. The circuit of claim 33, further comprising:

a fourth power amplifier connected to receive said input signal and produce a fourth amplified output signal at a fourth output on a fourth side of said monolithic microwave integrated circuit, said fourth power amplifier having at least one fourth transistor of at least one of said first or second transistor structures.

35. The circuit of claim 33, wherein at least one of said third transistors is of said second transistor structure, and further comprising:

a fourth power amplifier connected to receive said input signal and produce a fourth amplified output signal at a fourth output on said first side of said monolithic microwave integrated circuit, said fourth power amplifier having at least one fourth transistor of said first transistor structure.

* * * * *

UNITED STATES PATENT AND TRADEMARK OFFICE
CERTIFICATE OF CORRECTION

PATENT NO.     : 6,545,543 B2
DATED          : April 8, 2003
INVENTOR(S)    : Steven R. Nelson It is certified that error appears in the above-identified patent and that said Letters Patent is hereby corrected as shown below:

Column 5,
Line 7, replace "NMIC 200" with -- MMIC 2000 --

Column 6,
Line 6, replace "NMIC power" with -- MMIC power --

Signed and Sealed this

Thirtieth Day of September, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,545,543 B2
DATED : April 8, 2003
INVENTOR(S) : Steven R. Nelson

It is certified that error appears in the above-identified patent and that said Letters Patent is hereby corrected as shown below:

Column 5,
Line 7, replace "NMIC 200" with -- MMIC 200 --

Column 6,
Line 6, replace "NMIC power" with -- MMIC power --

Signed and Sealed this

Fourteenth Day of October, 2003

JAMES E. ROGAN
*Director of the United States Patent and Trademark Office*